(12) United States Patent
Ito et al.

(10) Patent No.: US 6,307,234 B1
(45) Date of Patent: Oct. 23, 2001

(54) COMPLEMENTARY MOS SEMICONDUCTOR DEVICE

(75) Inventors: Hiroshi Ito; Makoto Sasaki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/190,010

(22) Filed: Nov. 12, 1998

(30) Foreign Application Priority Data

Nov. 14, 1997 (JP) .................................................. 9-313985

(51) Int. Cl.[7] .................................................. H01L 29/78
(52) U.S. Cl. .................. 257/371; 257/357; 257/411; 257/351; 257/369
(58) Field of Search ..................... 257/369, 371, 257/351, 355, 357, 410, 411, 321; 326/13, 24, 34, 45, 58, 68, 71, 103, 121

(56) References Cited

U.S. PATENT DOCUMENTS

| | | | |
|---|---|---|---|
| 4,475,050 | * 10/1984 | Noufer | 307/475 |
| 4,672,243 | * 6/1987 | Kirsch | 307/475 |
| 5,789,788 | 8/1998 | Ema et al. . | |
| 5,847,432 | * 12/1998 | Nozaki | 257/369 |
| 5,900,665 | * 5/1999 | Tobita | 257/357 |
| 5,929,667 | * 7/1999 | Abadeer et al. | 327/112 |
| 5,985,706 | * 11/1999 | Gilmer et al. | 438/199 |
| 6,093,947 | * 7/2000 | Hanafi et al. | 257/334 |

FOREIGN PATENT DOCUMENTS

| | | |
|---|---|---|
| 06029834 | 2/1994 | (JP) . |
| 6-29834 | 2/1994 | (JP) . |
| 06350435 | 12/1994 | (JP) . |
| 07142605 | 6/1995 | (JP) . |
| 08191107 | 7/1996 | (JP) . |
| WO 97 38444 | 10/1997 | (WO) . |

OTHER PUBLICATIONS

Wolf, "Silicon Processing for the VLSI Era," vol. 3, pp. 421–422, 523–524, 1995.*

Wright P. J. et al.: Thickness Limitations of $SiO_2$ Gate Dielectrics for MOS ULSI, Aug. 1990, vol. 37, No. 8, pp. 1884–1892.

* cited by examiner

*Primary Examiner*—Fetsum Abraham
(74) *Attorney, Agent, or Firm*—Sughrue, Mion, Zinn, Macpeak & Seas, PLLC

(57) ABSTRACT

A complementary MOS semiconductor device comprising: a complementary MOS logic circuit having a plurality of field effect transistors; a first wiring and a second wiring as a source for supplying therethrough a power source voltage to the complementary MOS logic circuit; a first power supply circuit for controlling the supply of the power source voltage from said first wiring to said complementary MOS logic circuit; a second power supply circuit for controlling the supply of the power source voltage from said second wiring to said complementary MOS logic circuit; and a third power supply circuit for controlling the operation of said first power supply circuit, wherein said third power supply circuit includes field effect transistors each having a gate insulating film with 2.5 nm or more thickness.

9 Claims, 7 Drawing Sheets

COMPLEMENTARY MOS SEMICONDUCTOR DEVICE

BACKGROUND OF THE INVENTION

1. Field of the Invention

The present invention relates in general to a complementary MOS semiconductor device which is suitable for a mobile apparatus, and more particularly to a complementary MOS semiconductor device in which even if gate insulating films of field effect transistors constituting a complementary MOS logic circuit are made less than 2.5 nm in thickness, the power consumption in non-operation is efficiently reduced.

2. Description of the Prior Art

In recent years, the demand for mobile apparatuses has increased. The mobile apparatuses presuppose the outdoor use of personal computers, portable telephones and the like, and the electric power is supplied to the mobile apparatuses by a battery. For this reason, in the mobile apparatuses, it is very important to reduce the power consumption in the non-operation thereof as well as the power consumption in the operation thereof. In addition, as for a semiconductor device for use in the mobile apparatus, in particular, a complementary MOS semiconductor device is effective because the complementary MOS semiconductor device has the lower power consumption in the non-operation thereof.

However, if a threshold voltage of a MOS FET is lowered in order to increase the circuit operating speed of a semiconductor device, the power consumption in non-operation becomes high since a current which is caused to flow in non-operation (hereinafter, referred to as "a stand-by current" for short, when applicable) is increased. FIG. 4 is a circuit diagram showing a configuration of a circuit which is incorporated in a conventional complementary MOS semiconductor device. The conventional complementary MOS semiconductor device has two-stages inverters INV11 and INV12 incorporated therein. The inverter INV11 includes a p-channel MOS FET P11 and an n-channel MOS FET N11, and the inverter INV12 includes a p-channel MOS FET P12 and an n-channel MOS FET N12. Each of these MOS FETs P11, P12, N11 and N12, is a low threshold voltage MOS FET having a low threshold.

In the conventional complementary MOS semiconductor device thus configured, when a signal input to an input terminal IN11 which is connected to both of a gate of the p-channel MOS FET P11 and a gate of the n-channel MOS FET N11 which are provided in the inverter INV11 is held at a low level, the p-channel MOS FET P11 is in a conduction state, while the n-channel MOS FET N11 is in a nonconducting state. In this case, a signal input to the inverter INV12 is held at a high level so that the p-channel MOS FET P12 becomes a nonconducting state, while the n-channel MOS FET N12 becomes a conduction state. Then, a signal at a low level is output through an output terminal OUT11 which is connected to both of a drain of the p-channel MOS FET P12 and a drain of the n-channel MOS FET N12. At this time, though in the inverter INV11, the n-channel MOS FET N11 is in a nonconducting state, in actual, a large stand-by current is caused to flow resulting from that the MOS FET is of the low threshold voltage type. For this reason, a through current 21 corresponding to this stand-by current is caused to flow through the path extending from a power source line L11 to a GND line L12. In addition, in the inverter INV12, a through current 22 corresponding to a stand-by current of the p-channel MOS FET P12 is caused to flow through the path extending from the power source line L11 to the GND line L12. These through currents 21 and 22 result in the power consumption in non-operation being increased.

Then, the circuit which is designed in order to solve the above-mentioned disadvantage is proposed (refer to Japanese Patent Application Laid-open No. Hei6-29834). The circuit disclosed in this official gazette is designed on the basis of the logic circuit shown in FIG. 4, and there is provided therein means for separating the power source line and the GND line from that logic circuit. FIG. 5 is a circuit diagram showing a configuration of the circuit disclosed in Japanese Patent Application Laid-open No.Hei6-29834. In this connection, in the circuit shown in FIG. 5, parts similar to those in the logic circuit shown in FIG. 4 are denoted by the same reference numerals, and the detailed description thereof is omitted here for the sake of simplicity. In the circuit disclosed in Japanese Patent Application Laid-Open No. Hei 6-29834, a p-channel MOS FET P13 is provided as a power supply circuit S11 across a power source line L13 and a pseudo power source line V11, and also an n-channel MOS FET N13 is provided as a power supply circuit S12 across a GND line L14 and a pseudo GND line V12. Each of the p-channel MOS FET P13 and the n-channel MOS FET N13 is a high threshold voltage MOS FET having a high threshold. Now, a gate of the p-channel MOS FET P13 is connected to a switch SW11 through an inverter INV13, while a gate of the n-channel MOS FET N13 is connected directly to the switch SW11.

In the conventional circuit configured as described above, if the switch SW11 is caused to be a nonconducting state in non-operation by the inverters INV11 and INV12, both of the p-channel MOS FET P13 and the n-channel MOS FET N13 become a nonconducting state so that both of the inverters INV11 and INV12 are separated from the power source line 13 and the GND line 14. In addition, since each of the p-channel MOS FET P13 and the n-channel MOS FET N13 is the high threshold voltage MOS FET, the stand-by current thereof is remarkably thinner than that of the MOS FETS P11, P12, N11 and N12, and hence the through current which is caused to flow through the path extending from the power source line L13 to the GND line L14 is remarkably suppressed. As a result, the power consumption in non-operation is remarkably reduced.

In addition, there is proposed a circuit which is capable of reducing the power consumption in non-operation without reducing the operating speed (refer to Japanese Patent Application Laid-open No. Hei 7-38417). In the circuit disclosed in this official gazette, a first inverter comprised of a MOS transistor having a low threshold voltage and a second inverter comprised of a MOS transistor having a high threshold voltage are provided in a logic circuit. Further, the first inverter is designed in such a way as to be separated from a power source in the non-operation thereof.

According to the circuit disclosed in Japanese Patent Application Laid-open No. Hei 7-38417, during the operation, the high speed switching operation is carried out by the first inverter, while during the non-operation, the output level is held by the second inverter. For this reason, the power consumption in the non-operation can be suppressed to the remarkably low value.

However, there arises the problem that when MOS FETs are shrunk finely along with the promotion of the high speed operation and the high integration of LSIs so that the gate length becomes about 0.1 µm, in the conventional complementary MOS semiconductor device in which the circuit configured as described above is incorporated, the power consumption thereof in the non-operation is high. In particular, since in an LSI which is operated by a battery, even in the non-operation as well, the remarkably high power consumption is generated and the battery consumption becomes remarkable. In the present circumstances in which the demand for the mobile apparatus is more and more increased, it is very important to solve this problem.

The device parameters such as size and the like of MOS FETs are finely shrunk in accordance with a certain proportional scale down rule. As for the proportional scale down rules, there have been proposed the electric field—definite proportional scale down rule, the voltage—definite proportional scale down rule, the quasi-electric field—definite proportional scale down rule and the like. Then, in any of the proportional scale down rules, it is presupposed to shrink both of the gate length and the thickness of the gate insulating film with the same scale down ratio. In the actual devices as well, the gate length and the thickness of the gate insulating film are approximately, proportionally shrunk. Therefore, since the thickness of the gate insulating film of a CMOS with 0.25 µm gate length is in general 5 nm, it is introduced from the proportional scale down rule that the thickness of the gate insulating film of a CMOS with about 0.1 µm gate length is in the range of 2.0 to 2.5 nm. That is, if in order that a MOS FET may be finely shrunk, the gate length is made about 0.1 µm and the thickness of the gate insulating film within a logic circuit is made thinner than 2.5 nm, then the power consumption in non-operation will be increased.

BRIEF SUMMARY OF THE INVENTION

Object of the Invention

Summary of the Invention

In the light of the foregoing, the present invention was made in order to solve the above-mentioned problems associated with the prior art, and it is therefore an object of the present invention to provide a complementary MOS semiconductor device in which even when the thickness of a gate insulating film in a logic circuit is made thinner than 2.5 nm, the power consumption in non-operation can be suppressed.

According to one aspect of the present invention, there is provided a complementary MOS semiconductor device including: a complementary MOS logic circuit having a plurality of field effect transistors; a first wiring and a second wiring as a source for supplying therethrough a power source voltage to the complementary MOS logic circuit; a first power supply circuit for controlling the supply of the power source voltage from the first wiring to the complementary MOS logic circuit; a second power supply circuit for controlling the supply of the power source voltage from the second wiring to the complementary MOS logic circuit; and a third power supply circuit for controlling the operation of the first power supply circuit, wherein the third power supply circuit includes field effect transistors each having a gate insulating film with 2.5 nm or more thickness.

In the one aspect of the present invention, since the field effect transistors each having the gate insulating film with 2.5 nm or more thickness are provided in the third power supply circuit, in non-operation of the complementary MOS logic circuit, the power consumption can be reduced by suppressing a direct tunnel current which is caused to flow through the gate insulating film.

According to another aspect of the present invention, there is provided a complementary MOS semiconductor device including: a complementary MOS logic circuit having a plurality of field effect transistors; a first wiring and a second wiring as a source for supplying therethrough a power source voltage to the complementary MOS logic circuit; a first power supply circuit for controlling the supply of the power source voltage from the first wiring to the complementary MOS logic circuit; a second power supply circuit for controlling the supply of the power source voltage from the second wiring to the complementary MOS logic circuit; and a third power supply circuit for controlling the operation of the first power supply circuit, characterized in that wells of the plurality of field effect transistors provided in the complementary MOS logic circuit are electrically insulated from the first wiring and the second wiring.

In the another aspect of the present invention, since the wells of the plurality of field effect transistors provided in the complementary MOS logic circuit are electrically insulated from the first wiring and the second wiring, the power consumption can be reduced by suppressing the current flowing through the path therebetween.

At least one kind of circuit which is selected from the group consisting of the first power supply circuit and the second power supply circuit includes preferably field effect transistors each having the gate insulating film with 2.5 nm or more thickness.

By providing the field effect transistors each having the gate insulating film with 2.5 nm or more thickness in the first power supply circuit or the second power supply circuit, the sufficient voltage can be supplied in the operation of the complementary MOS logic circuit. In particular, the above-mentioned field effect transistors are provided in both of the power supply circuits, whereby the effect provided thereby is increased.

In this connection, the gate insulating film of the above-mentioned field effect transistor may be formed of a silicon oxide film or a silicon nitride oxide film, and also the silicon oxide film may be formed by oxidizing the surface of a silicon substrate by the operation of a nitrogen oxide.

BRIEF DESCRIPTION OF THE DRAWINGS

The above and other objects as well as advantages of the present invention will become clear by the following description of the preferred embodiments of the present invention with reference to the accompanying drawings, wherein.

DETAILED DESCRIPTION OF THE PREFERRED EMBODIMENTS

As a result of carrying out earnestly, repeatedly the experiments and studies in order to solve the above-mentioned problems associated with the prior art, the present inventors found out that if the thickness of the gate insulating film in the conventional logic circuit is made thinner than 2.5 nm, then a direct tunnel current is caused to flow through the gate insulating film even in non-operation, and hence the power consumption in the non-operation can be suppressed by reducing this direct tunnel current.

Figure 6A:
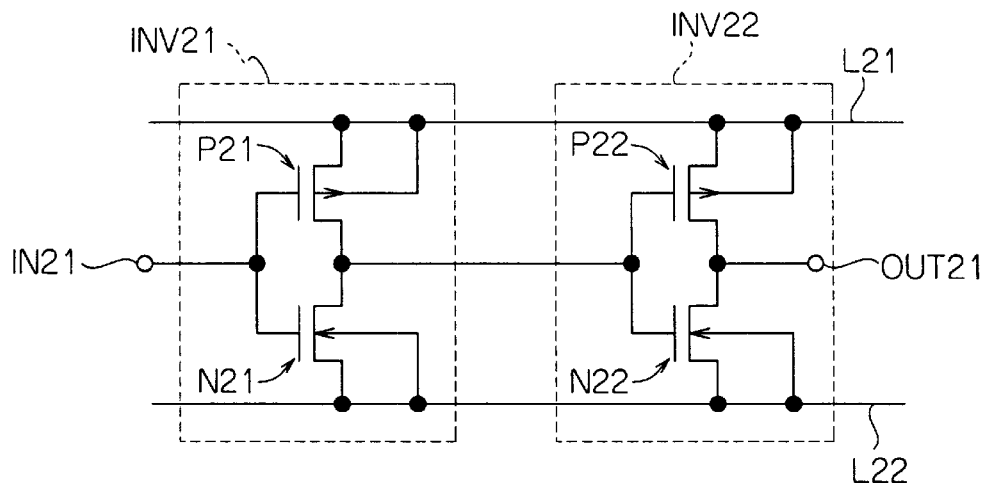
FIG. 6A is a circuit diagram showing a configuration of an example of a circuit including MOS FETs each having a gate insulating film with a thickness of less than 2.5 nm.
Figure 6B:
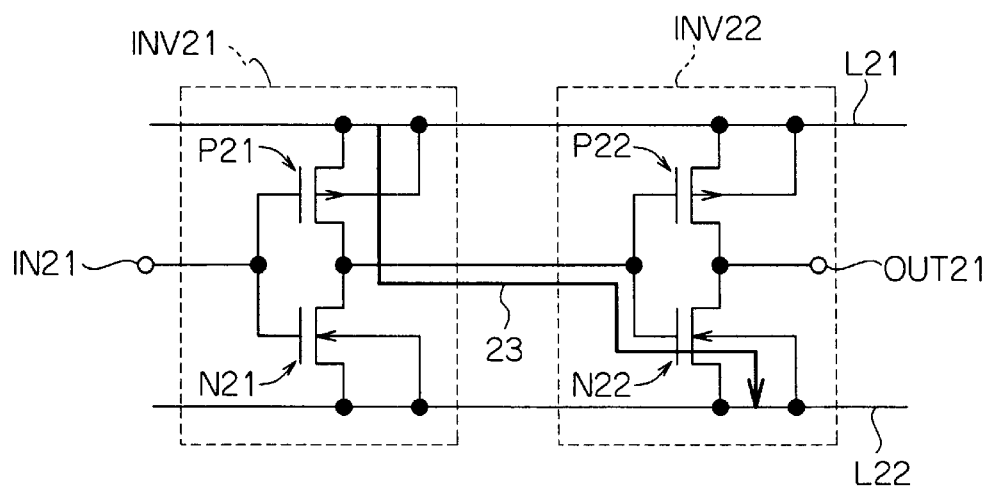
FIG. 6B is a circuit diagram useful in explaining a through current which is generated in the circuit shown in FIG. 6A.
Figure 6C:
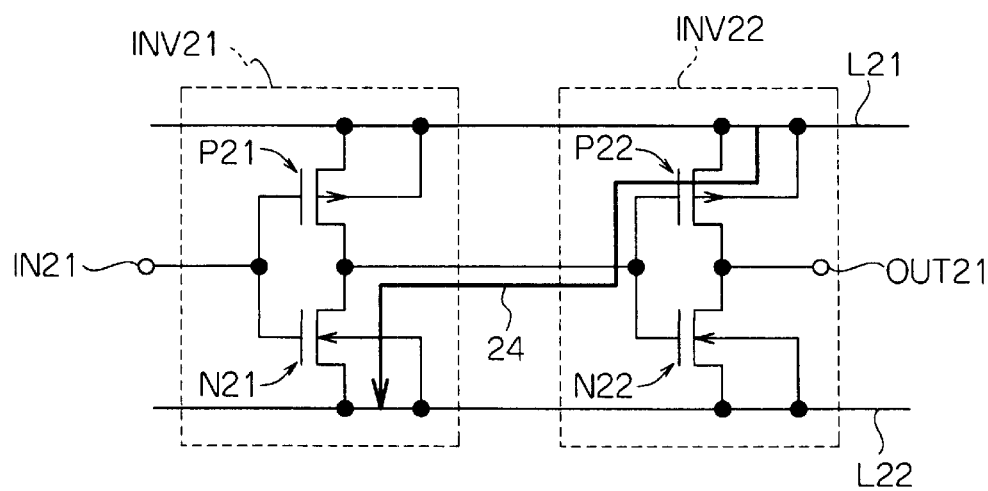
FIG. 6C is a circuit diagram useful in explaining a through current which is generated in the circuit shown in FIG. 6A.

Now, the description will hereinbelow be given with respect to the direct tunnel current (the cause of increase in the power consumption) which is generated in the gate insulating film in the conventional circuit. FIG. 6A is a circuit diagram showing a configuration of an example of a circuit including MOS FETs each having a gate insulating film with a thickness of less than 2.5 nm, FIG. 6B is a circuit diagram useful in explaining a through current which is generated in the circuit shown in FIG. 6A, and FIG. 6C is a circuit diagram useful in explaining a through current which is generated in the circuit shown in FIG. 6A. In the example of the circuit shown in FIG. 6A, in a similar manner to that in the conventional example, the two-stages inverters INV21 and INV22 are incorporated. The inverter INV21 includes a p-channel MOS FET P21 and an n-channel MOS FET N21, and the inverter INV22 includes a p-channel MOS FET P22 and an n-channel MOS FET N22. Each of the MOS FETs P21, P22, N21 and N22 is the high threshold voltage MOS FET having a high threshold.

In the circuit configured as described above, when a signal input to an input terminal IN21 which is connected to a gate of the p-channel MOS FET P21 and a gate of the n-channel MOS FET N21 in the inverter INV21 is held at a low level, the p-channel MOS FET P21 is in a conduction state, while the n-channel MOS FET N21 is in a nonconducting state. In this case, a signal which is input to the inverter INV22 is held at a high level so that the p-channel MOS FET P22 becomes a nonconducting state and the n-channel MOS FET N22 becomes a conduction state. Then, a signal at a low level is output through an output terminal OUT21 which is connected to both of a drain of the p-channel MOS FET P22 and a drain of the n-channel MOS FET N22. At this time, since the signal which is input to the inverter INV21 is held at a low level so that the circuit is in a normal (non-operation) state, and also each of the p-channel MOS FET P21 and the n-channel MOS FET N21 is the high threshold voltage MOS FET, if the thickness of the gate insulating film is equal to or larger than 2.5 nm, then the current is hardly caused to flow through the path extending from a power source line L21 to a GND line L22.

However, since in this example, the thickness of the gate insulating film is thinner than 2.5 nm, as shown in FIG. 6B, the direct tunnel current is caused to flow through the gate insulating film of the n-channel MOS FET N22. As a result, a through current 23 is caused to flow through the path extending from the power source line L21 to the GND line L22. In addition, when the signal which is input to an input terminal IN21 is held at a high level, the direct tunnel current is caused to flow through the gate insulating film of the p-channel MOS FET P22, and hence a through current 24 is caused to flow through the path extending from the power source line L21 to the GND line L22.

Figure 7A:
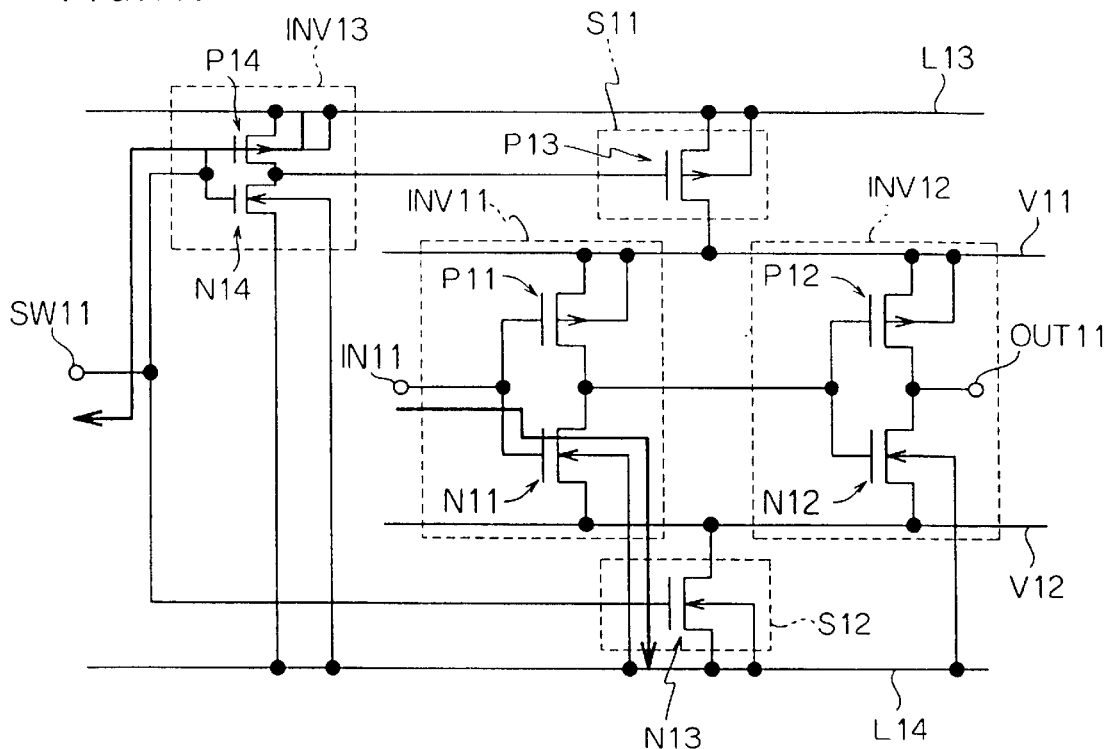
FIG. 7A is a circuit diagram useful in explaining a through current which is caused to flow through a circuit disclosed in Japanese Patent Application Laid-open No. Hei 6-29834 when a thickness of a gate insulating film is made 2.0 nm.
Figure 7B:
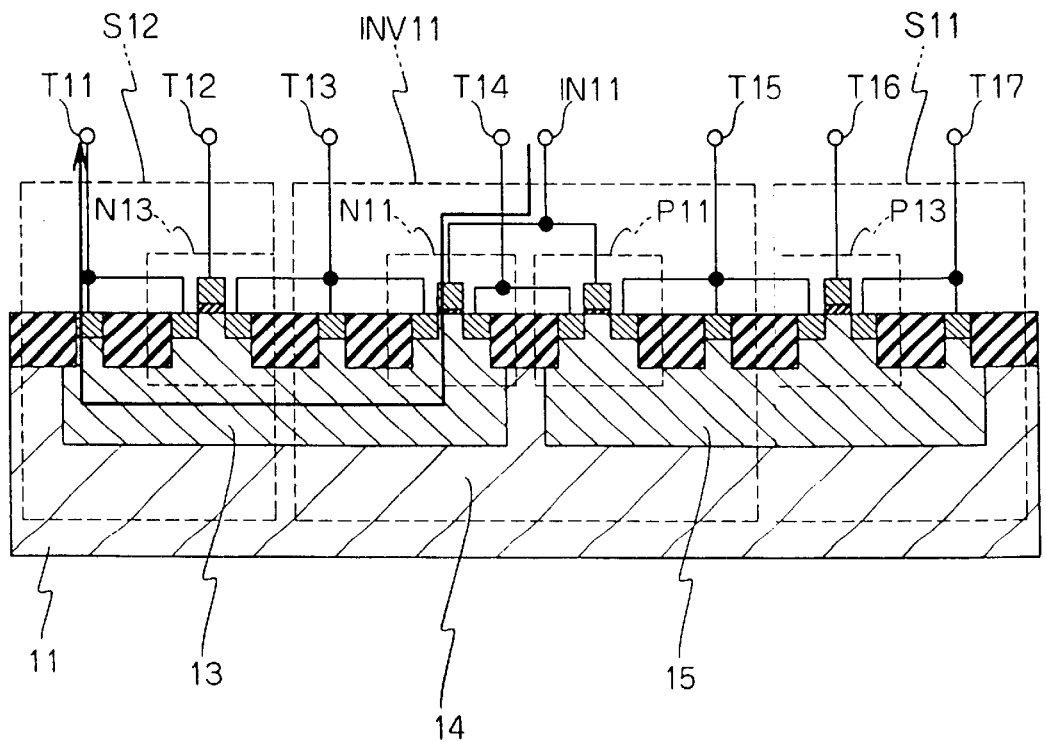
FIG. 7B is a schematic cross sectional view showing the structure of a semiconductor device in which the circuit shown in FIG. 7A is incorporated on a P type semiconductor substrate.

In the circuit as well which is disclosed in Japanese Patent Application Laid-open No. Hei 6-29834, if the thickness of the gate insulating film is made thinner than 2.5 nm, for instance, equal to 2.0 nm, similarly, the through current is caused to flow. FIG. 7A is a circuit diagram useful in explaining a through current which is caused to flow through a circuit disclosed in Japanese Patent Application Laid-open No. Hei 6-29834 when a thickness of a gate insulating film is made 2.0 nm, and FIG. 7B is a schematic cross sectional view showing the structure of a semiconductor device in which this circuit shown in FIG. 7A is incorporated on a P type semiconductor substrate. The inverter INV13 shown in FIG. 7A includes a p-channel MOS FET P14 and an n-channel MOS FET N14 each of which is the high threshold voltage MOS FET. In addition, in FIG. 7B, a terminal T11 is connected to a GND line L14, and a terminal T12 is connected to a switch SW11. In addition, a terminal T13 is connected to a pseudo GND line V12, and a terminal T14 is connected to an inverter INV12. A terminal T15 is connected to a pseudo power source line V11, and a terminal T16 is connected to the switch SW11 through an inverter INV13. A terminal T17 is connected to a power source line L13. Also, both of the n-channel MOS FETs N11 and N13 are formed in a P type well 13 which is at the same potential as that of the GND line L14, while both of the p-channel MOS FETs P11 and P13 are formed in an N type well 15 which is at the same potential as that of the power source line L13. In addition, both of the P type well 13 and the N type well 15 are formed in the same P type semiconductor substrate 11.

In this circuit, in non-operation of the logic circuit including the inverters INV11 and INV12, the pseudo power source line V11 and the pseudo GND line V12 are respectively separated from the power source line L13 and the GND line L14 by decreasing the amplitude of the input signal to the switch SW11 to a low level. As a result, any of through currents such as the through currents 23 and 24 shown in FIGS. 6B and 6C, respectively, is not caused to flow at all.

However, since the thickness of the gate insulating film is 2.0 nm, and as shown in FIG. 7A, the power source line L13 is at the same potential as that of the N type well of the p-channel MOS FET P4, if a signal at a low level is input to the switch SW11, then the direct tunnel current is caused to flow through the gate insulating film of the p-channel MOS FET P4, which results in a through current 25 being caused to flow. In addition, since the thickness of the gate insulating film is 2.0 nm, and as shown in FIG. 7B, the P type well 13 of the n-channel MOS FET N11 is at the same potential as that of the GND line L14 connected to the terminal T11, if the input signal is held at a high level, then the direct tunnel current is caused to flow through the gate insulating film of the n-channel MOS FET Ni1, which results in a through current 26 being caused to flow. In addition, when the input signal is held at a low level, since the N type well 15 of the p-channel MOS FET P11 is at the same potential as that of the power source line L13 connected to the terminal T17, the direct tunnel current is caused to flow through the gate insulating film of the p-channel MOS FET P11, which results in a through current being caused to flow. Since the through current due to the direct tunnel current is different from the through current which is the problem associated with the prior art, in the conventional circuit, even if the switch SW11 is placed in a nonconducting state, such a through current can not be suppressed.

Figure 8:
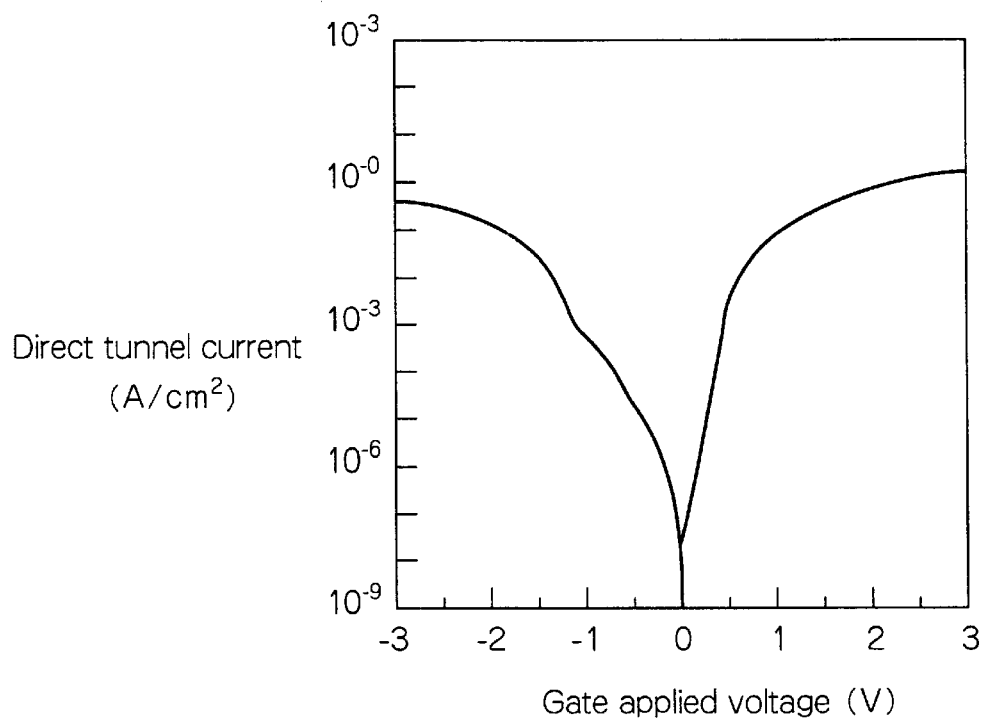
FIG. 8 is a graphical representation showing the relation between a gate applied voltage and a direct tunnel current.

The result of measuring the direct tunnel current flowing through an n-channel MOS FET having a gate insulating film with 2 nm thickness by the present inventors is shown in FIG. 8. FIG. 8 is a graphical representation showing the relation between a gate applied voltage, on the axis of abscissa, which is applied to the gate and a direct tunnel current on the axis of ordinate. In the region in which the gate applied voltage is positive, the n-channel MOS FET is in the inversion state, while in the region in which the gate applied voltage is negative, the n-channel MOS FET is in the accumulation state. In this connection, the direct tunnel current in the inversion state is larger than that in the accumulation state by the amount corresponding to a flat band voltage.

Figure 9:
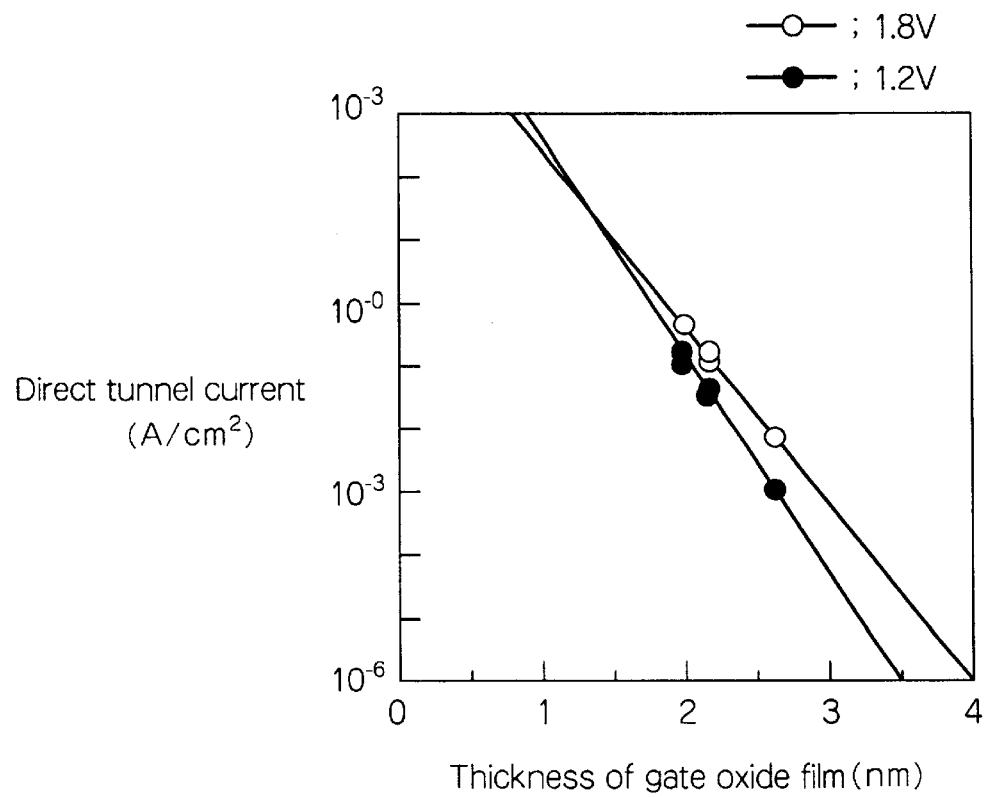
FIG. 9 is a graphical representation showing the relation between a thickness of a gate oxide film and a direct tunnel current.

In addition, the dependency of the direct tunnel current on the thickness of the gate oxide film is shown in FIG. 9. FIG. 9 is a graphical representation showing the relation between the thickness of the gate oxide film on the axis of abscissa and the direct tunnel current on the axis of ordinate. In FIG. 9, open symbols ○ represent the direct tunnel current when the power source voltage is 1.8 V, and black symbols ● represent the direct tunnel current when the power source voltage is 1.2 V. As apparent from the figure, the dependency of the direct tunnel current on the thickness of the gate insulating film is very remarkable, and hence whenever the gate insulating film is thinned by 0.2 nm, the direct tunnel current increases by about one digit.

Figure 10:
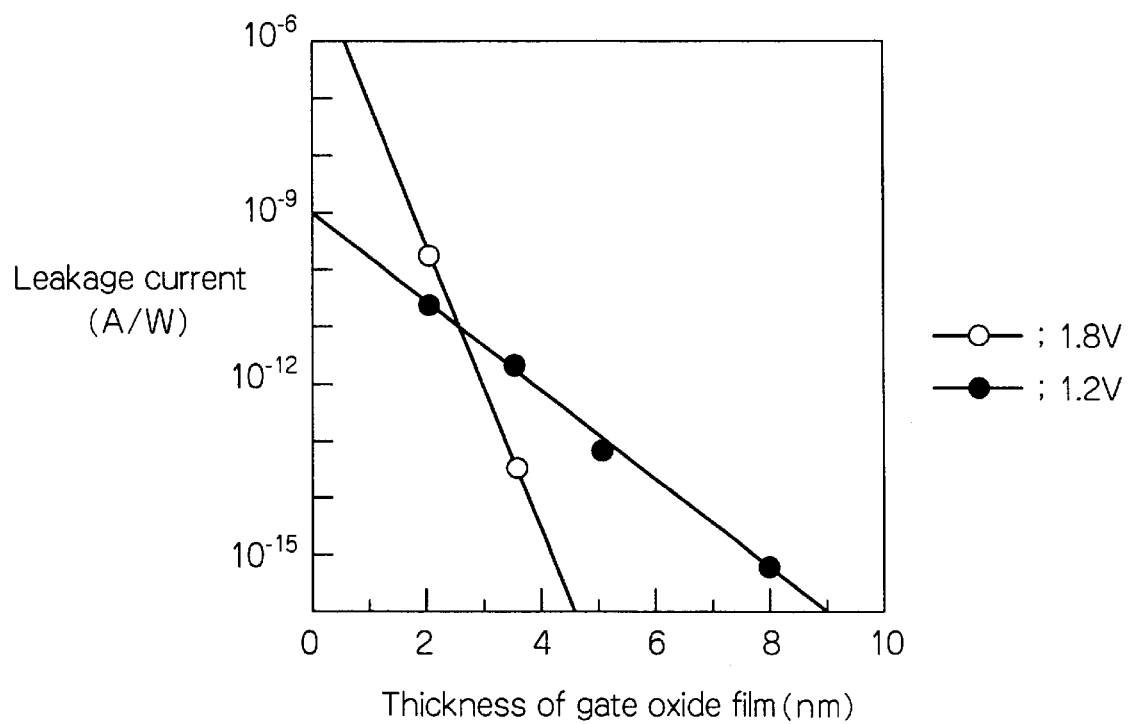
FIG. 10 is a graphical representation showing the relation between a thickness of a gate oxide film and a leakage current.

From the above-mentioned result, there is shown in FIG. 10 the result of comparing the leakage current due to the stand-by current when it is assumed that no direct tunnel current is caused to flow with the leakage current due to the direct tunnel current. FIG. 10 is a graphical representation showing the relation between the thickness of the Gate insulating film on the axis of abscissa and the leakage current on the axis of ordinate. In this connection, the gate width of the MOS transistor is 1 μm. In FIG. 10, open symbols ○ represent the leakage current due to the direct tunnel current, and black symbols ● represent the leakage current due to the stand-by current. As shown in FIG. 10, when the thickness of the gate insulating film becomes thinner than 2.5 nm, the leakage current due to the direct tunnel current is larger than the stand-by current of the MOS transistor. In other words, in the leakage current which is caused to flow through the path extending from the power source line to the GND line during non-operation of the complementary MOS semiconductor device in which the gate length is thinner than 0.1 μm or so in the region where the thickness of the gate insulating film is thinner than 2.5 nm, the through current due to the direct tunnel current is the predominant current.

Now, complementary MOS semiconductor devices according to the preferred embodiment of the present invention will hereinafter be described in detail with reference to the accompanying drawings.

Figure 1A:
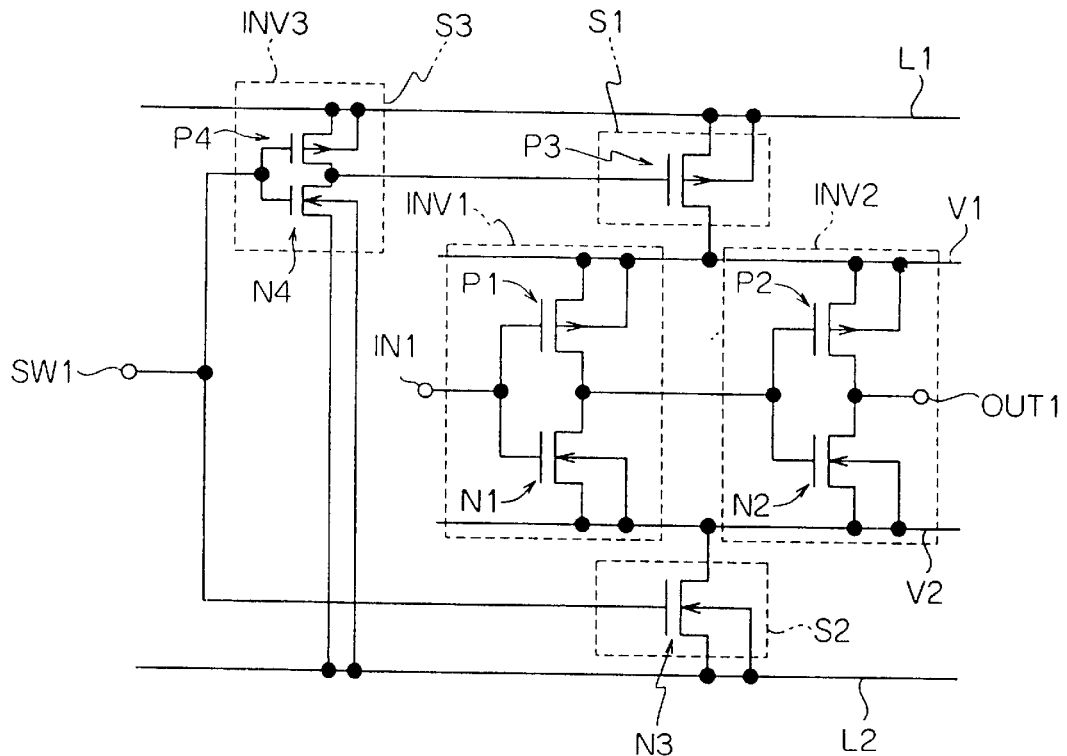
FIG. 1A is a circuit diagram showing a configuration of a circuit which is incorporated in a complementary MOS semiconductor device according to a first embodiment of the present invention.
Figure 1B:
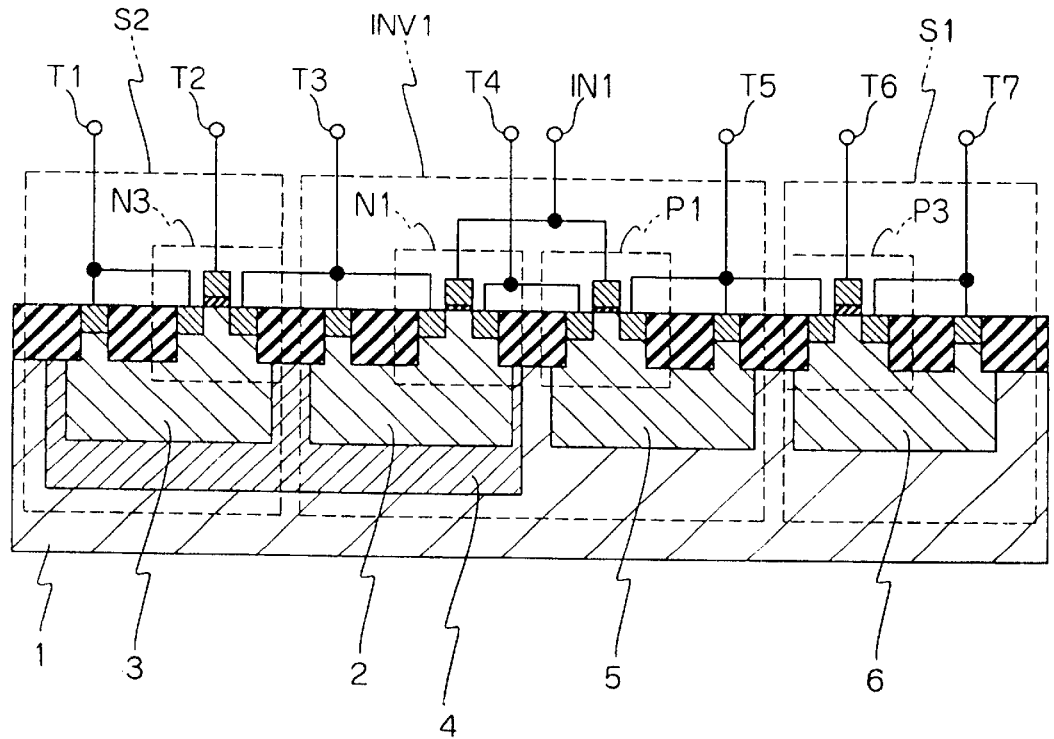
FIG. 1B is a cross sectional view showing schematically the structure of the complementary MOS semiconductor device according to the first embodiment of the present invention.

FIG. 1A is a circuit diagram showing a configuration of a circuit which is incorporated in a complementary MOS semiconductor device according to a first embodiment of the present invention, and FIG. 1B is a schematic cross sectional view showing the structure of the complementary MOS semiconductor device according to the first embodiment of the present invention. In the present embodiment, an internal logic circuit including two-stages inverters INV1 and INV2 is incorporated. The inverter INV1 includes a p-channel MOS FET P1 and an n-channel MOS FET N1, and the inverter INV2 includes a p-channel MOS FET P2 and an n-channel MOS FET N2. Each of these MOS FETs P1, P2, N1 and N2 is a MOS FET having a gate insulating film with 2 nm thickness. The gate insulating film is, for example, formed of a silicon oxide film or a silicon nitride oxide film which is formed by nitriding a silicon oxide film. The silicon oxide film is, for example, formed by oxidizing the surface of a silicon substrate by the operation of the nitrogen oxide. Sources and a well of the p-channel MOS FETs P1 and P2 are connected to a pseudo power source line V1. In addition, sources and a well of the n-channel MOS FETs N1 and N2 are connected to a pseudo GND line V2. Then, a p-channel MOS FET P3 is connected as a power supply circuit S1 to the pseudo power source line V1, and an n-channel MOS FET N3 is connected as a power supply circuit S2 to the pseudo GND line V2. In addition, a power source line L1 is connected to the power supply circuit S1, and a GND line L2 is connected to the power supply circuit S2. Also, an inverter INV3 is connected as a power supply circuit S3 to a gate of the p-channel MOS FET P3. A switch SW1 is connected to both of the inverter INV3 and a gate of the n-channel MOS FET N3. As a result, the p-channel MOS FET P3 and the n-channel MOS FET N3 are operated simultaneously. The inverter INV3 includes a p-channel MOS FET P4 and an n-channel MOS FET N4. The p-channel MOS FET P4 is connected to the power source line L1, and the n-channel MOS FET N4 is connected to the GND line L2. In this connection, each of the p-channel MOS FET P4 and the n-channel MOS FET N4 is a MOS FET having a gate insulating film with 4 nm thickness.

In addition, in FIG. 1B, a terminal T1 is connected to the GND line L2, and a terminal T2 is connected to the switch SW1. Also, a terminal T3 is connected to the pseudo GND line V2, and a terminal T4 is connected to the inverter INV2. A terminal T5 is connected to the pseudo power source line V1, and a terminal T6 is connected to the switch SW1 through the inverter INV3. Also, a terminal T7 is connected to the power source line L1.

Further, as shown in FIG. 1B, the n-channel MOS FET N1 is formed in a first P type well 2, and the n-channel MOS FET N3 is formed in a second P type well 3. Also, the first P type well 2 and the second P type well 3 are formed in the same third N type well 4 so as to be located apart from each other. As a result, the first P type well 2 and the second P type well 3 are electrically insulated from each other. In addition, the p-channel MOS FET P1 is formed in a first N type well 5, and the p-channel MOS FET P3 is formed in a second N type well 6. Also, all of the first N type well 5, the second N type well 6 and the third N type well 4 are formed in a P type semiconductor substrate 1 so as to be located apart from one another. As a result, the first N type well 5 and the second N type well 6 are electrically insulated from each other. In this connection, if being electrically insulated from the second N type well 6, then a p-channel MOS FET P2 (not shown in FIG. 1B) may be formed in the same first N type well 5 as that of the p-channel MOS FET P1. Also, if being electrically insulated from the second P type well 3, then an n-channel MOS FET N2 (not shown in FIG. 1B) may be formed in the same first P type well 2 as that of the n-channel MOS FET N1.

Next, the description will hereinbelow be given with respect to the operation of the first embodiment having the circuit configured as described above.

The switch SW1 is placed in a nonconducting state in the non-operation of the internal logic circuit including the inverters INV1 and INV2, whereby similarly to the prior art, the internal logic circuit is separated from the power source line L1 and the GND line L2, and hence the power source voltage is not supplied to the internal logic circuit. As a result, the through current such as the through current 23 or 24 shown in FIG. 6B or FIG. 6C is prevented from being generated. In addition, since the thickness of the gate insulating film of the p-channel MOS FET P4 is 4 nm, the direct tunnel current is prevented from being generated in the p-channel MOS FET P4. This results in the through current such as the through current 25 shown in FIG. 7A being prevented from being generated. Further, since the first P type well 2 and the second P type well 3 are electrically insulated from each other, even when the signal at a high level is held at the input terminal IN1, the through current such as the through current 26 shown in FIGS. 7A and 7B is prevented from being generated. Also, since the first N type well 5 and the second N type well 6 are electrically insulated from each other, when the signal at a low level is held at the input terminal IN1, the through current is prevented from being caused to flow through the path extending from the input terminal IN1 to the power source line L1.

In this connection, the gate insulating films of the p-channel MOS FET P3 and the n-channel MOS FET N3 are not limited in thickness. But, if the thickness of the gate insulating film of the p-channel MOS FET P3 is thinner than 2.5 nm, then a current is caused to flow through the path extending from the power source line L1 to the gate of the p-channel MOS FET P3 in the operation of the inverters INV1 and INV2, and if the thickness of the gate insulating film of the n-channel MOS FET N3 is thinner than 2.5 nm, then a current is caused to flow through the path extending from the gate of the n-channel MOS FET N3 to the GND line L2 in the operation of the inverters INV1 and INV2. For this reason, the sufficient voltage may not be supplied to the pseudo power source line V1 or the pseudo GND line V2 in some cases. Therefore, the gate insulating films of the p-channel MOS FET P3 and the n-channel MOS FET N3 are desirably equal to or larger than 2.5 nm in thickness.

Figure 2:
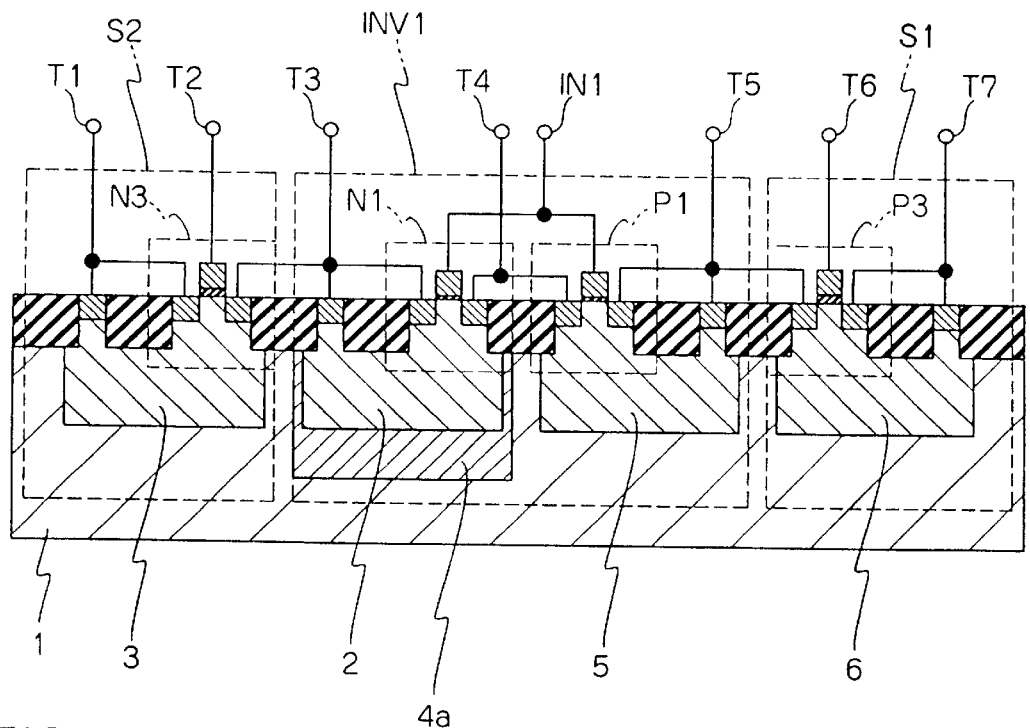
FIG. 2 is a schematic cross sectional view showing the structure of a complementary MOS semiconductor device according to a second embodiment of the present invention.

Next, a second embodiment of the present invention will hereinbelow be described in detail. In the present embodiment as well, the circuit shown in FIG. 1A is provided. The structure of the wells having the MOS FETs formed therein of the present embodiment is different from that of the first embodiment. FIG. 2 is a schematic cross sectional view showing the structure of a complementary MOS semiconductor device according to the second embodiment of the present invention. In the second embodiment shown in FIG. 2, those parts corresponding to their counter parts of the first embodiment shown in FIG. 1B are denoted by the same reference numerals, and the detailed description thereof is omitted here for the sake of simplicity. In the present embodiment, the first P type well 2 is formed in a third N type well 4a, while the second P type well 3 is directly formed in the P type semiconductor substrate 1. In such a way, the first P type well 2 and the second P type well 3 are electrically insulated from each other.

For this reason, in the present embodiment as well, the direct tunnel current is not caused to flow through the n-channel MOS FET N1 when the signal at a high level is held at the input terminal IN1 so that a through current such as the through current 26 shown in FIGS. 7A and 7B is prevented from being generated.

Figure 3:
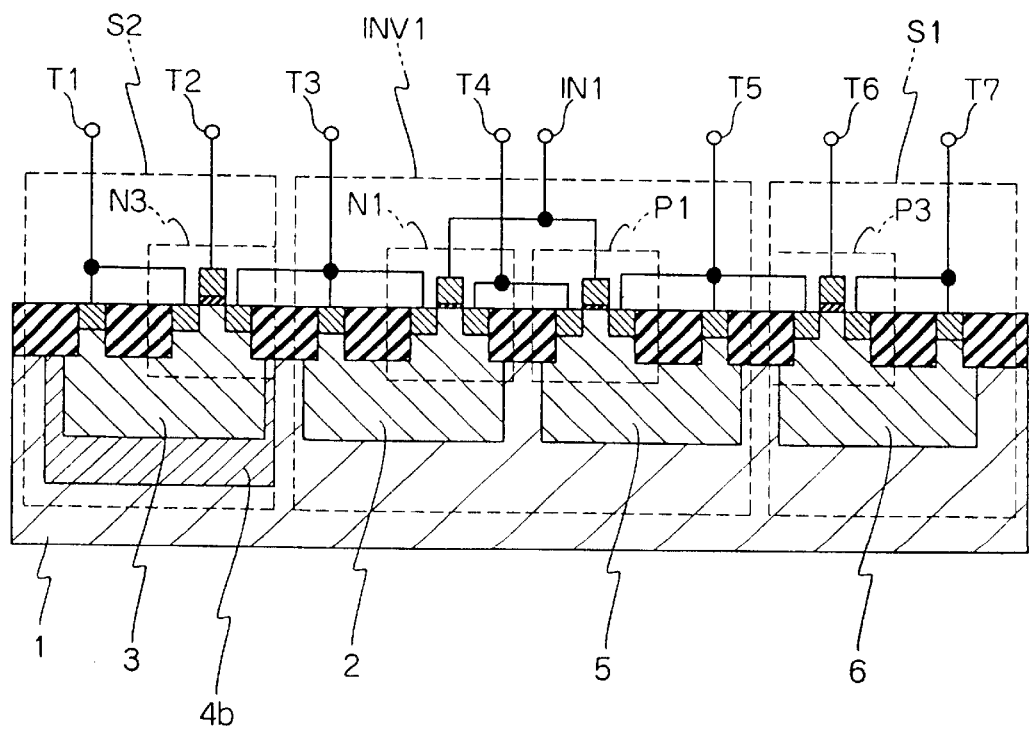
FIG. 3 is a schematic cross sectional view showing the structure of a complementary MOS semiconductor device according to a third embodiment of the present invention.
Figure 4:
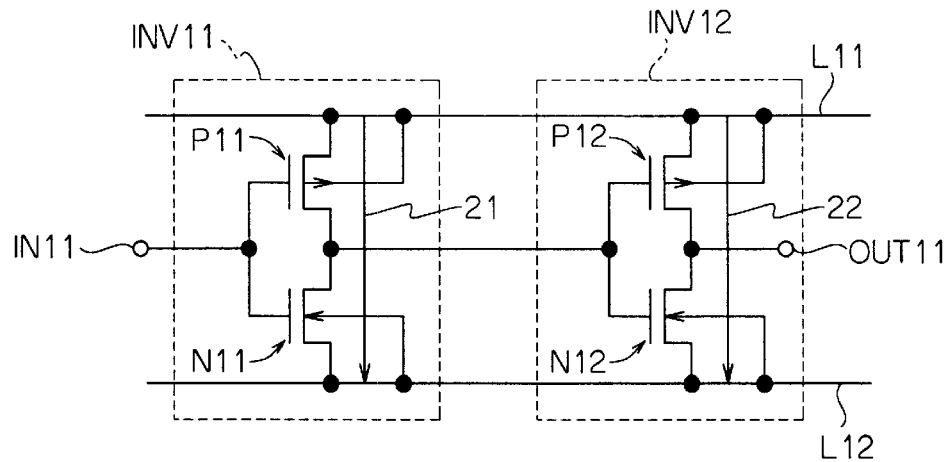
FIG. 4 is a circuit diagram showing a configuration of a circuit which is incorporated in a conventional complementary MOS semiconductor device.
Figure 5:
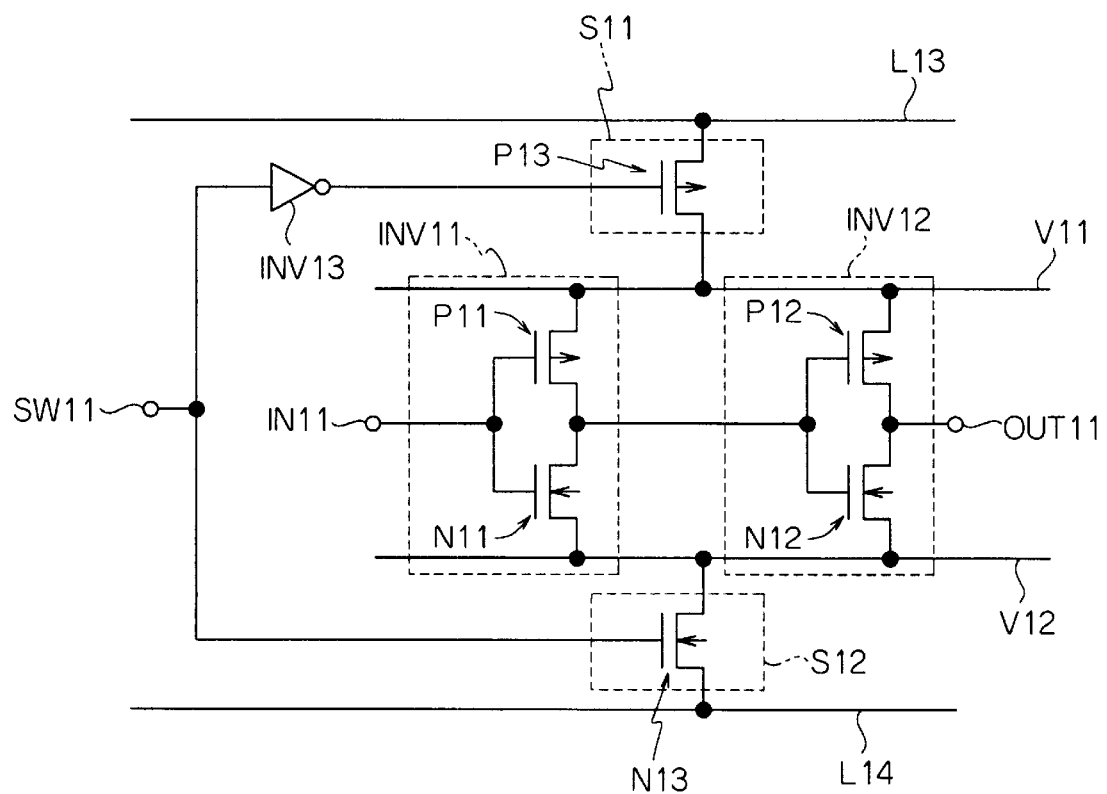
FIG. 5 is a circuit diagram showing a configuration of a circuit which is disclosed in Japanese Patent Application Laid-open No. Hei 6-29834.

Next, a third embodiment of the present invention will hereinbelow be described. In the present embodiment as well, the circuit shown in FIG. 1A is provided. The present embodiment is also, similarly to the second embodiment, different in structure of the wells having the MOS FETs formed therein from the first embodiment. FIG. 3 is a schematic cross sectional view showing the structure of a complementary MOS semiconductor device according to the third embodiment of the present invention. In the third embodiment shown in FIG. 3, those parts corresponding to their counter parts of the first embodiment shown in FIG. 1B are denoted by the same reference numerals, and the detailed description thereof is omitted here for the sake of simplicity. In the present embodiment, the second P type well 3 is formed in a third N type well 4b, while the first P type well 2 is directly formed in the P type semiconductor substrate 1. In such a way, the first P type well 2 and the second P type well 3 are electrically insulated from each other.

For this reason, in the present embodiment as well, the direct tunnel current is not caused to flow through the n-channel MOS FET N1 when the signal at a high level is held at the input terminal IN1 so that a through current such as the through current 26 shown in FIGS. 7A and 7B is prevented from being generated.

In this connection, when the elements are formed on a P type semiconductor substrate, as described above, the N type well 4 and the like are required through which the P type wells 2 and 3 are electrically insulated from each other, while when the elements are formed on an N type semiconductor substrate, a P type well is required through which the N type wells 5 and 6 are electrically insulated from each other.

As set forth hereinabove, according to the present invention, gate insulating films of field effect transistors which are provided in a power supply circuit are made equal to or larger than 2.5 nm in thickness, whereby it is possible to suppress a direct tunnel current which is caused to flow through the power supply circuit during non-operation of a complementary MOS logic circuit. In addition, wells of the field effect transistors which are provided in the complementary MOS logic circuit are electrically insulated from a first wiring and a second wiring thereof, whereby it is possible to prevent any of direct tunnel currents from being caused to flow through the path extending therebetween. For this reason, it is possible to reduce remarkably a through current flowing through the path extending from a power source line to a GND line, and hence it is possible to reduce the power consumption in non-operation of a complementary MOS semiconductor device in which the complementary MOS logic circuit including the field effect transistors each having a gate insulating film with a thickness of less than 2.5 nm is incorporated.

While the present invention has been particularly shown and described with reference to the preferred embodiments and the specified modifications thereof, it will be understood that the various changes and other modifications will occur to those skilled in the art without departing from the scope and true spirit of the invention. The scope of the invention is therefore to be determined solely by the appended claims.

What is claimed is:

1. A complementary MOS semiconductor device comprising:

a complementary MOS logic circuit having a plurality of field effect transistors each having a gate insulating film less than 2.5 nm thickness;

a first wiring and a second wiring electrically connected as a source to supply therethrough a power source voltage to the complementary MOS logic circuit;

a first power supply circuit, electrically connected to said first wiring and to said complementary MOS logic circuit, to control the supply of the power source voltage from said first wiring to said complementary MOS logic circuit;

a second power supply circuit, electrically connected to said second wiring and said complementary MOS logic circuit, to control the supply of the power source voltage from said second wiring to said complementary MOS logic circuit; and a third power supply circuit, electrically connected to said first power supply circuit, to control the operation of said first power supply circuit, wherein said third power supply circuit comprises field effect transistors each having a gate insulating film with 2.5 nm or more thickness, wherein wells of said field effect transistors which are provided in said complementary MOS logic circuit are electrically insulated from said first wiring and said second wiring.

2. A complementary MOS semiconductor device according to claim 1, wherein at least one kind of circuit of said first power supply circuit and said second power supply circuit includes field effect transistors each having a gate insulating film with 2.5 nm or more thickness.

3. A complementary MOS semiconductor device according to claim 2, wherein the gate insulating film of the field effect transistor is one kind of insulating film which is selected from a silicon oxide film and a silicon nitride oxide film.

4. A complementary MOS semiconductor device according to claim 1, wherein the gate insulating film of the field effect transistor is one kind of insulating film which is selected from a silicon oxide film and a silicon nitride oxide film.

5. A complementary MOS semiconductor device according to claim 4, wherein the silicon oxide film is formed by oxidizing the surface of a silicon substrate by the operation of a nitrogen oxide.

6. A complementary MOS semiconductor device comprising:

a complementary MOS logic circuit having a plurality of field effect transistors each having a gate insulating film less than 2.5 nm thickness;

a first wiring and a second wiring electrically connected as a source to supply therethrough a power source voltage to the complementary MOS logic circuit;

a first power supply circuit, electrically connected to said first wiring and to said complementary MOS logic circuit, to control the supply of the power source voltage from said first wiring to said complementary MOS logic circuit;

a second power supply circuit, electrically connected to said second wiring and said complementary MOS logic circuit, to control the supply of the power source voltage from said second wiring to said complementary MOS logic circuit; and a third power supply circuit, electrically connected to said first power supply circuit, to control the operation of said first power supply circuit, wherein wells of said field effect transistors are electrically insulated from said first wiring and said second wiring.

7. A complementary MOS semiconductor device according to claim 6, wherein at least one kind of circuit of said first power supply circuit and said second power supply circuit includes field effect transistors each having a gate insulating film with 2.5 nm or more thickness.

8. A complementary MOS semiconductor device according to claim 7, wherein the gate insulating film of the field effect transistor is one kind of insulating film which is selected from a silicon oxide film and a silicon nitride oxide film.

9. A complementary MOS semiconductor device according to claim 6, wherein the gate insulating film of the field effect transistor is one kind of insulating film which is selected from a silicon oxide film and a silicon nitride oxide film.

* * * * *